(12) United States Patent
Kaigawa

(10) Patent No.: US 7,750,349 B2
(45) Date of Patent: Jul. 6, 2010

(54) SWITCHING ELEMENT SUBSTRATE, FOR A LIQUID CRYSTAL DISPLAY DEVICE, INCLUDING AN INSULATING SUBSTRATE

(75) Inventor: Hiroyuki Kaigawa, Mie (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 552 days.

(21) Appl. No.: 11/200,181

(22) Filed: Aug. 10, 2005

(65) Prior Publication Data

US 2006/0033855 A1    Feb. 16, 2006

(30) Foreign Application Priority Data

Aug. 16, 2004   (JP)   .............. 2004-236463

(51) Int. Cl.
  H01L 27/14   (2006.01)
  H01L 29/04   (2006.01)
  H01L 29/15   (2006.01)
  H01L 31/036  (2006.01)
(52) U.S. Cl. .............. 257/72; 257/59; 257/E27.001
(58) Field of Classification Search ............. 257/59, 257/72, 347
  See application file for complete search history.

(56) References Cited

U.S. PATENT DOCUMENTS

| 5,415,043 | A | * | 5/1995 | Zabler et al. ............. 73/514.38 |
| 5,434,433 | A | | 7/1995 | Takasu et al. |
| 5,514,885 | A | * | 5/1996 | Myrick ..................... 257/216 |
| 5,530,266 | A | | 6/1996 | Yonehara et al. |
| 5,659,192 | A | * | 8/1997 | Sarma et al. ............... 257/347 |
| 6,346,717 | B1 | * | 2/2002 | Kawata ..................... 257/72 |
| 6,624,450 | B1 | * | 9/2003 | Yamazaki et al. .......... 257/192 |
| 2001/0040662 | A1 | * | 11/2001 | Cheng et al. .............. 349/141 |
| 2002/0053673 | A1 | * | 5/2002 | Misawa et al. ............. 257/72 |
| 2002/0066953 | A1 | * | 6/2002 | Ishiwata et al. ........... 257/700 |
| 2002/0125481 | A1 | * | 9/2002 | Kimura ..................... 257/72 |
| 2004/0188705 | A1 | * | 9/2004 | Yeo et al. .................. 257/170 |

FOREIGN PATENT DOCUMENTS

| JP | 5-273591 A | 10/1993 |
| JP | 6-67205 A | 3/1994 |
| JP | 7-240527 A | 9/1995 |
| JP | 2001-28441 A | 1/2001 |
| JP | 2003-316281 A | 11/2003 |

* cited by examiner

*Primary Examiner*—Kenneth A Parker
*Assistant Examiner*—Anthony Ho
(74) *Attorney, Agent, or Firm*—Birch, Stewart, Kolasch & Birch, LLP

(57) ABSTRACT

A switching element substrate for a liquid crystal display device for transmissive display includes an insulating substrate, and a plurality of switching elements formed on one of surfaces of the insulating substrate. A transmitting region is defined on an exposed part of the other surface of the insulating substrate. Each of the switching elements includes a monocrystalline silicon layer.

7 Claims, 7 Drawing Sheets

1

SWITCHING ELEMENT SUBSTRATE, FOR A LIQUID CRYSTAL DISPLAY DEVICE, INCLUDING AN INSULATING SUBSTRATE

CROSS REFERENCE TO RELATED APPLICATIONS

This application claims priority under 35 U.S.C. §119 on Patent Application No. 2004-236463 filed in Japan on Aug. 16, 2004, the entire contents of which are hereby incorporated by reference.

BACKGROUND OF THE INVENTION

The present invention relates to a switching element substrate for liquid crystal display devices for transmissive display, a manufacturing method of the switching element substrate, and a liquid crystal display device.

Liquid crystal display devices (LCDs) have been actively studied and developed due to their advantages such as light weight, thin thickness, and low power consumption.

LCDs are divided into two types based on their operation principles: a simple matrix type and an active matrix type. Active matrix LCDs have active elements such as a plurality of thin-film transistors (TFTs) as switching elements for turning on or off each pixel. The active matrix LCDs are thus capable of sending a signal to each pixel independently. As a result, the active matrix LCDs have an excellent resolution and provide a clear image display.

The active matrix LCDs have a switching element substrate in which a plurality of switching elements are arranged in a matrix, a counter substrate facing the switching element substrate, and a liquid crystal layer provided between the switching element substrate and the opposing substrate. The active matrix LCDs display an image by driving the liquid crystal layer by the switching elements of the switching element substrate.

LCDs are also divided into two types: reflective LCDs for displaying an image by reflecting ambient light; and transmissive LCDs for displaying an image by transmitting light from a backlight (a light source). The transmissive LCDs are superior to the reflective LCDs in that the transmissive LCDs can display a high-quality image regardless of the brightness of the outside.

A conventional TFT substrate that is used in transmissive LCDs as a switching element substrate will be described with reference to FIG. 13. FIG. 13 is an enlarged cross-sectional view of a TFT formed on the TFT substrate.

The TFT substrate has a plurality of pixels arranged in a matrix, and a TFT 120 is provided for each pixel. Each pixel has a transmitting region that transmits light from the back side (i.e., from the bottom in FIG. 13).

Each TFT 120 is generally formed on a transparent glass substrate 101 capable of transmitting light (e.g., Japanese Laid-Open Patent Publication No. 7-240527). For example, a polysilicon film 106 is formed on the glass substrate 101. The polysilicon film 106 has a drain region 114, a source region 113, and a channel region 109 formed between the drain region 114 and the source region 113.

A gate oxide film 110, an insulating film, is formed on the polysilicon film 106. A gate electrode 111 is formed on the channel region 109 with the gate oxide film 110 interposed therebetween. The drain region 114 and the source region 113 are formed by implanting ions into the polysilicon film 106 at a high concentration by using the gate electrode 111 as a mask. It is also known in the art that an amorphous silicon film can be used instead of the polysilicon film 106.

A gate wiring (not shown) is connected to the gate electrode 111, and a source wiring (not shown) is connected to the source region 113. A pixel electrode (not shown) is connected to the drain region 114. The pixel electrode is provided in a transmitting region of each pixel, and is formed from a transparent electrode so that the pixel electrode can transmit light.

The liquid crystal layer is driven pixel by pixel according to a signal voltage applied to each pixel electrode through a corresponding source region 113 and a corresponding drain region 114. As a result, light from a backlight (not shown) located on the bottom side (i.e., on the back side) is selectively transmitted, whereby transmissive display is provided.

An SOI (Silicon On Insulator) substrate is known in the art. The SOI silicon is a silicon substrate having a monocrystalline silicon layer formed on a surface of an insulating layer. FIG. 14 is a cross-sectional view of a commonly used SOI substrate.

As shown in FIG. 14, an SOI substrate 130 generally has a sandwich structure. More specifically, the SOI substrate 130 has two monocrystalline silicon layers 131, 132 and a silicon oxide layer 133 (an insulating layer) formed between the monocrystalline silicon layers 131, 132.

There are two methods for producing an SOI substrate: an ion implantation method; and a substrate lamination method. In the ion implantation method, oxygen ions are implanted into a silicon wafer and the silicon wafer is then heat treated. For example, oxygen ions are implanted with an implantation energy of 180 keV and a dose of $1 \times 10^{18}$ cm$^{-2}$. In this way, an SOI substrate having a sandwich structure, an SOI substrate having a silicon oxide film formed at a prescribed depth of a silicon wafer, can be produced.

In the substrate lamination method, a silicon oxide film is formed on the surface of a silicon wafer, and another silicon wafer is laminated on the surface of the silicon oxide film. One of the silicon wafers is ground to a desired thickness. An SOI substrate having a sandwich structure can thus be produced.

When semiconductor devices such as TFTs are formed on an SOI substrate, TFTs can be formed from a monocrystalline silicon layer. Therefore, reduced parasitic capacitance and increased insulation resistance can be implemented as compared to the case where the above TFTs, TFTs formed from a polysilicon film or an amorphous silicon film, are used. As a result, the integration and the operating frequency of a device can be significantly increased.

However, a processing temperature of about 800° C. is required to form TFTs from a monocrystalline silicon layer although glass that is commonly used for a glass substrate has a relatively low melting point of about 600° C. Therefore, TFTs of a monocrystalline silicon layer cannot be formed on a transparent glass substrate.

TFTs of a monocrystalline silicon layer can be formed on an SOI substrate. However, an SOI substrate itself does not transmit light. Therefore, an SOI substrate cannot be used as a TFT substrate for transmissive LCDs.

SUMMARY OF THE INVENTION

The present invention is made in view of the above problems, and it is an object of the present invention to significantly improve the operating frequency of switching elements in a switching element substrate for liquid crystal display devices (LCDs).

In order to achieve the above object, in the present invention, a plurality of switching elements having a monocrystalline silicon layer are formed on an insulating substrate that forms a transmitting region.

According to a first aspect of the present invention, a switching element substrate for a liquid crystal display device for transmissive display includes an insulating substrate, and a plurality of switching elements formed on one of surfaces of the insulating substrate. A transmitting region is defined on an exposed part of the other surface of the insulating substrate. Each of the switching elements includes a monocrystalline silicon layer.

According to a second aspect of the present invention, a switching element substrate for a liquid crystal display device for transmissive display includes an insulating substrate, and a plurality of switching elements formed on one of surfaces of the insulating substrate. A transmitting region is provided by forming, on the other surface of the insulating substrate, a monocrystalline silicon layer having such a thickness that allows light to be transmitted therethrough. Each of the switching elements includes a monocrystalline silicon layer.

Preferably, the insulating substrate is a silicon oxide film. The insulating substrate may be a silicon nitride film or an aluminum oxide film.

Preferably, the one of the surfaces of the insulating substrate is exposed by removing the monocrystalline silicon layer between adjacent switching elements.

The switching elements may be thin film transistors.

According to a third aspect of the present invention, a liquid crystal display device for transmissive display includes a switching element substrate of the above first or second aspect of the present invention, a counter substrate which faces the switching element substrate, and a liquid crystal layer which is provided between the counter substrate and the switching element substrate.

According to a fourth aspect of the present invention, a method for manufacturing a switching element substrate for a liquid crystal display device for transmissive display includes an element formation step and a removing step. In the element formation step, a plurality of switching elements are formed on an SOI substrate that includes an insulating substrate and monocrystalline silicon layers formed on both surfaces of the insulating substrate. The plurality of switching elements are formed from the monocrystalline silicon layer on one of surfaces of the SOI substrate. In the removing step, a transmitting region is formed by removing at least a part of the monocrystalline silicon layer on the other surface of the SOI substrate.

In the removing step, the monocrystalline silicon layer is preferably removed by a dry etching method.

In the removing step, the monocrystalline silicon layer may be removed by a wet etching method.

In the removing step, the monocrystalline silicon layer may be removed by at least one of a mechanical polishing method and a chemical polishing method.

Preferably, the insulating substrate is formed from a silicon oxide film. The insulating substrate may be formed from a silicon nitride film or an aluminum oxide film.

The switching elements may be thin film transistors.

In the element formation step, one of the surfaces of the insulating substrate is preferably exposed by removing the monocrystalline silicon layer between adjacent switching elements.

[Effects]

Hereinafter, effects of the present invention will be described.

In the above switching element substrate, each switching element formed on one of surfaces of an insulating substrate includes a monocrystalline silicon layer. Therefore, an operating frequency is significantly increased as compared to switching elements having, e.g., polysilicon or amorphous silicon. Moreover, the switching element substrate has an insulating substrate having a transmitting region. Therefore, the switching element substrate enables transmissive display while achieving a melting point higher than that of a commonly used glass substrate.

By exposing the other surface of the insulating substrate, luminance of transmitted light is improved. By providing, on the other surface of the insulating substrate, monocrystalline silicon having such a thickness that allows light to be transmitted therethrough, strength of the switching element substrate itself can be improved while assuring luminance of transmitted light.

Moreover, the switching element substrate and a counter electrode laminated to the switching element substrate with a liquid crystal layer interposed therebetween form a liquid crystal display device. Therefore, even when strength of the switching element substrate is relatively small, sufficient overall strength is assured by laminating the switching element substrate to the counter substrate.

An element formation step and a removing step are conducted to manufacture the switching element substrate. In the element formation step, a plurality of switching elements are formed on an SOI substrate that includes an insulating substrate and monocrystalline silicon layers formed on both surfaces of the insulating substrate. The plurality of switching elements are formed from the monocrystalline silicon layer on one of surfaces of the SOI substrate. In the removing step, a transmitting region is formed in the switching element substrate by removing at least a part of the monocrystalline silicon layer on the other surface of the SOI substrate.

In the removing step, a dry etching method or a wet etching method may be used. At least one of a mechanical polishing method and a chemical polishing method may be used. By this process, at least a part of the monocrystalline silicon layer is removed.

In the element formation step, the monocrystalline silicon layer on one of the surfaces of the insulating substrate may be removed between adjacent switching elements. As a result, the one of the surfaces of the insulating substrate is exposed, whereby the switching elements can be isolated from each other. Therefore, a separate element isolation film is not required.

DETAILED DESCRIPTION OF THE INVENTION

Figure 1:
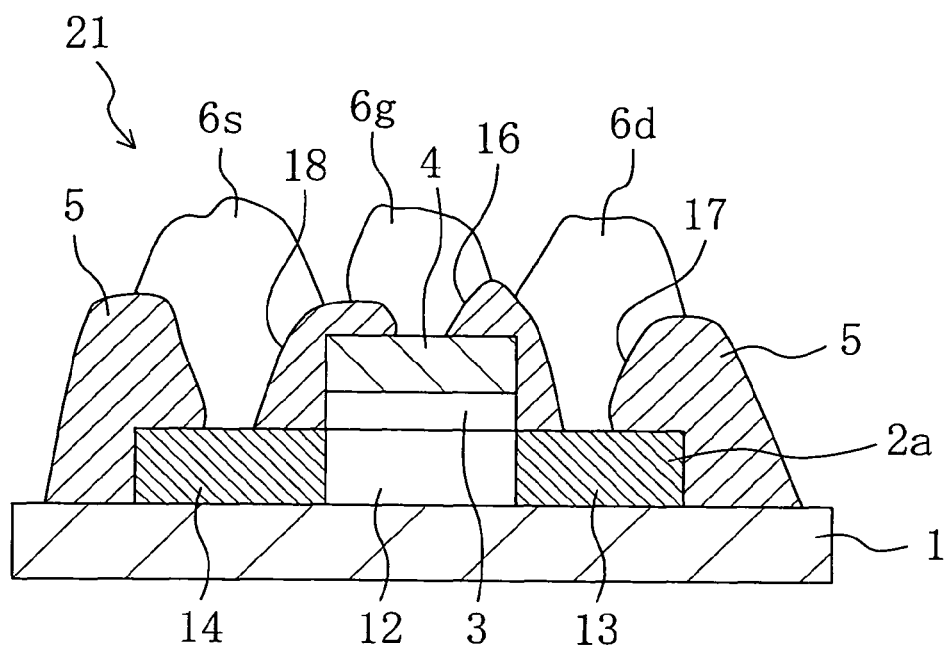
FIG. 1 is an enlarged cross-sectional view of a TFT substrate according to a first embodiment of the present invention.

Hereinafter, embodiments of the present invention will be described in detail with reference to the accompanying drawings. Note that the present invention is not limited to the following embodiments. The "upper side" in the figures such as FIG. 1 is herein referred to as "front side" or "upper side," and the "bottom side" in the figures such as FIG. 1 is herein referred to as "back side" or "bottom side."

First Embodiment

FIGS. 1 through 11 show a switching element substrate for liquid crystal display devices (LCDs), a method for manufacturing the switching element substrate, and an LCD according to a first embodiment of the present invention.

Figure 2:
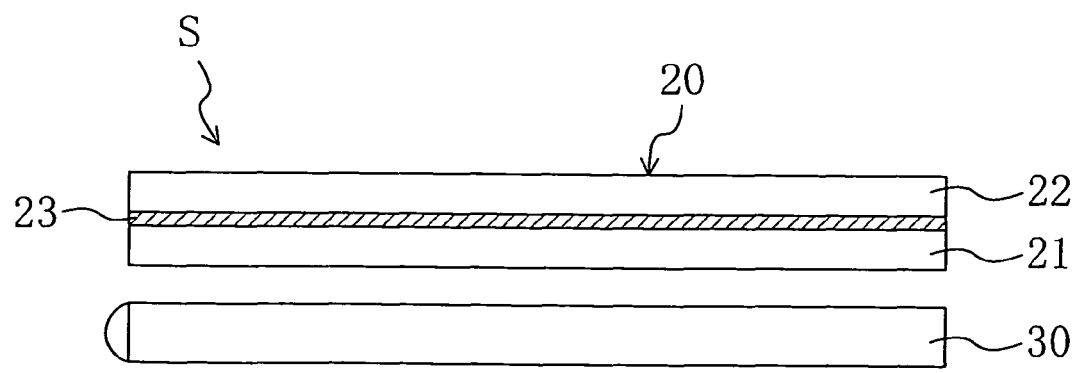
FIG. 2 is a schematic cross-sectional view of a transmissive liquid crystal display device (LCD) S.

FIG. 2 is a schematic cross-sectional view of a liquid crystal display device (LCD) S. As shown in FIG. 2, the LCD S includes a liquid crystal display element 20 and a backlight 30 (a light source) provided on the back side (on the bottom side in FIG. 2) of the liquid crystal display element 20. In other words, the LCD S is a transmissive LCD for displaying an image by selectively transmitting light of the backlight 30 by the liquid crystal display element 20.

The liquid crystal display element 20 includes a TFT substrate 21 (a switching element substrate), a counter substrate 22 facing the TFT substrate 21, and a liquid crystal layer 23 formed between the counter substrate 22 and the TFT substrate 21.

Although details of the backlight 30 are not shown in the figure, the backlight 30 includes a light guiding plate, a light source (such as a plurality of light-emitting diodes) provided on the side of the light guiding plate, a reflective sheet provided on the back side (on the bottom side in FIG. 2) of the light guiding plate, and an optical sheet provided on the front side (on the upper side in FIG. 2) of the light guiding plate.

The TFT substrate 21 is used for LCDs for transmissive display. As shown in an enlarged cross-sectional view of FIG. 1, the TFT substrate 21 includes an insulating substrate 1 formed from, e.g., a silicon oxide film, and a plurality of thin-film transistors (TFTs, switching elements) formed on one surface (the front surface, the upper surface in FIG. 1) of the insulating substrate 1. Each TFT includes a monocrystalline silicon layer 2a.

Figure 11:
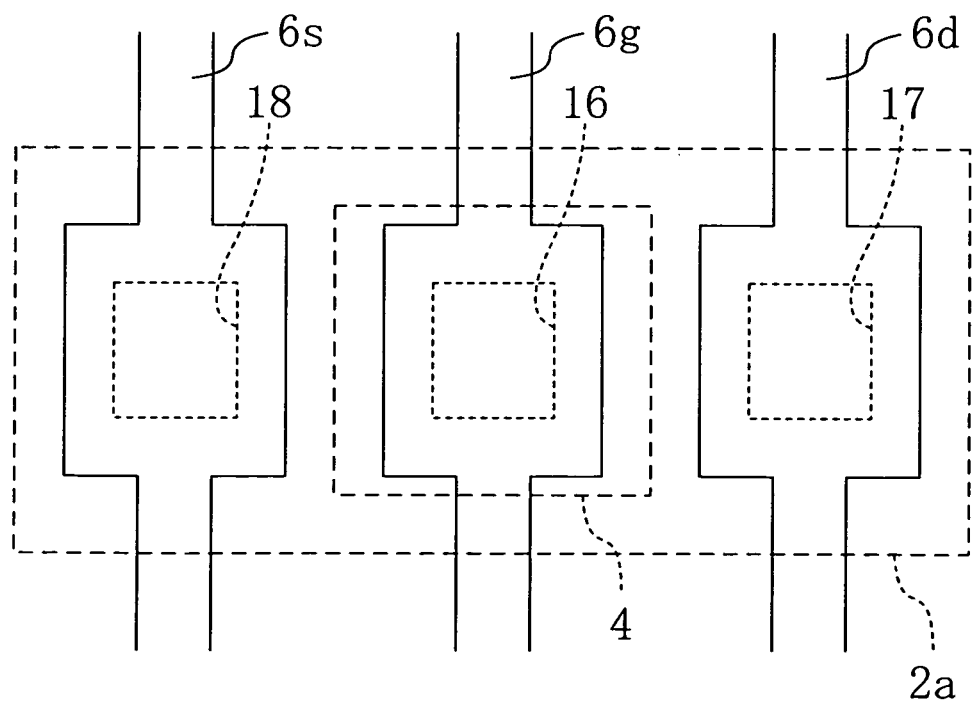
FIG. 11 is an enlarged plan view of a main part of a TFT substrate.

The structure of the TFT substrate 21 will be described with reference to FIG. 1 and FIG. 11 (a plan view).

A monocrystalline silicon layer 2a having an island shape is patterned on the front surface of the insulating substrate 1. The monocrystalline silicon layer 2a forms an active region of a TFT. A channel region 12 is formed in the middle of the monocrystalline silicon layer 2a. A drain region 13 and a source region 14 are formed on both sides of the channel region 12.

A gate oxide film 3 is formed on the front surface (the upper surface in FIG. 1) of the channel region 12. A gate electrode 4 is formed on the front surface of the gate oxide film 3. The gate oxide film 3 and the gate electrode 4 have the same shape as that of the front surface of the channel region 12. The gate oxide film 3 insulates the gate electrode 4 and the channel region 12 from each other.

An insulating protective film 5 is formed on the monocrystalline silicon layer 2a, the gate oxide film 3, and the gate electrode 4. Contact holes 16, 17, and 18 are formed in the insulating protective film 5. The contact hole 16 is formed on the gate electrode 4, the contact hole 17 is formed on the drain region 13, and the contact hole 18 is formed on the source region 14.

The contact holes 16, 17, and 18 are filled with a conductive material to form a gate wiring 6g, a drain wiring 6d, and a source wiring 6s, respectively. The gate wiring 6g is connected to the gate electrode 4 through the contact hole 16. The drain wiring 6d is connected to the drain region 13 through the contact hole 17. The source wiring 6s is connected to the source region 14 through the contact hole 18.

The monocrystalline silicon layer 2a is removed between adjacent TFTs so that the front surface of the insulating substrate 1 is exposed between adjacent TFTs. In other words, adjacent TFTs are isolated from each other on the insulating substrate 1.

The TFT substrate 21 has a transmitting region. The transmitting region is formed by exposing the other surface (the back surface, the bottom surface of FIG. 1) of the insulating substrate 1. In the present embodiment, the entire back surface of the insulating substrate 1 is exposed to the outside. Therefore, light from the backlight 30 is transmitted to the liquid crystal layer through the insulating substrate 1 in the transmitting region.

[Manufacturing Method]

Hereinafter, a method for manufacturing the TFT substrate 21 will be described with reference to FIGS. 3 through 10.

In the manufacturing method of the present embodiment, the TFT substrate 21 is manufactured by conducting an element formation step and a removing step to an SOI (Silicon On Insulator) substrate.

Figure 3:
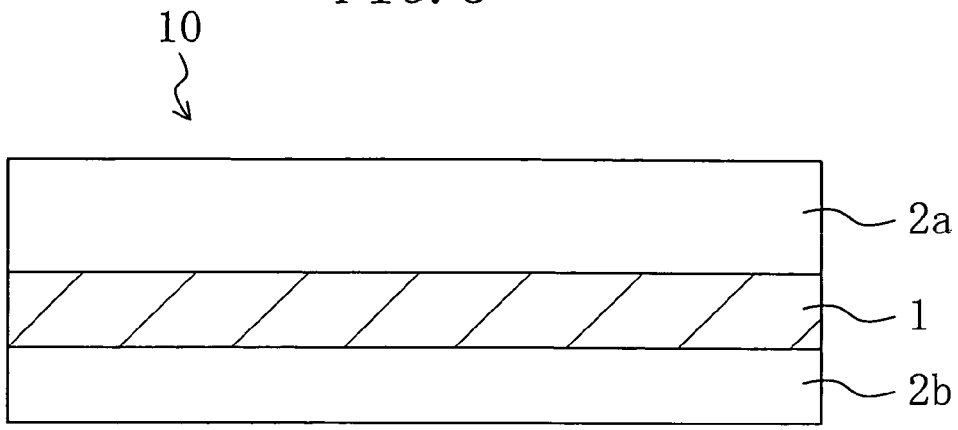
FIG. 3 is a schematic cross-sectional view of an SOI substrate.

FIG. 3 is a cross-sectional view of an SOI substrate 10. The SOI substrate 10 includes a silicon oxide film 1 (an insulating substrate 1), and monocrystalline silicon layers 2a, 2b formed on both surfaces of the silicon oxide film 1. The first monocrystalline silicon layer 2a is formed on the front surface of the silicon oxide film 1, and the second monocrystalline silicon layer 2b is formed on the back surface of the silicon oxide film 1. In other words, the silicon oxide film 1 forming the TFT substrate 21 is an oxide film (Buried Oxide Layer: BOL) that has been originally formed in the SOI substrate 10.

The SOI substrate 10 may be formed either by an ion implantation method (a method for implanting oxygen ions into a silicon wafer) or a substrate lamination method (a method for laminating another silicon wafer on the surface of the silicon oxide film 1 formed on a silicon wafer). Alternatively, the SOI substrate 10 may be formed by other known methods.

In the element formation step, a plurality of TFTs are formed from the first monocrystalline silicon layer 2a of the SOI substrate 10. In the removing step, a transmitting region is formed by removing at least a part of the second monocrystalline silicon layer 2b of the SOI substrate 10.

The element formation step includes an oxide-film formation step, an active-region patterning step, a gate-electrode formation step, an ion implantation step, a protective-film formation step, and a wiring formation step.

Figure 4:
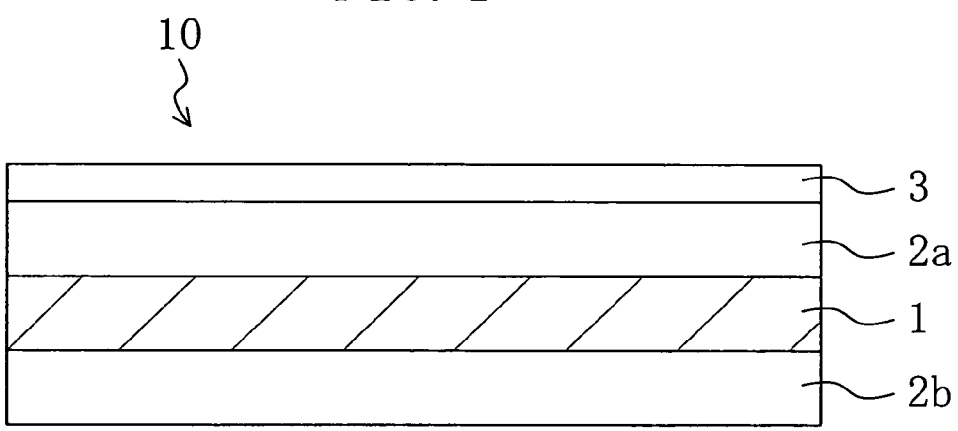
FIG. 4 is a cross-sectional view of an SOI substrate having an oxide film formed on its surface in an oxide-film formation step.

As shown in FIG. 4, in the oxide-film formation step, an oxide film 3 is formed on the front surface of the SOI substrate 10. The oxide film 3 needs to have a prescribed thickness in order to serve as a gate oxide film of TFTs. In general, a driving voltage of TFTs for LCDs is several tens of volts. Therefore, the gate oxide film 3 needs to have a thickness of about 500 nm.

In this case, in order to ensure electric characteristics and reliability of TFTs, a thermal oxidation method, a plasma enhanced chemical vapor deposition (PE-CVD) method, or a low-pressure chemical vapor deposition (LP-CVD) method is preferably used in the oxide-film formation step.

In the active-region patterning step, a prescribed region is first protected by an etching blocking film (such as photoresist) in order to pattern an active region of TFTs.

Figure 5:
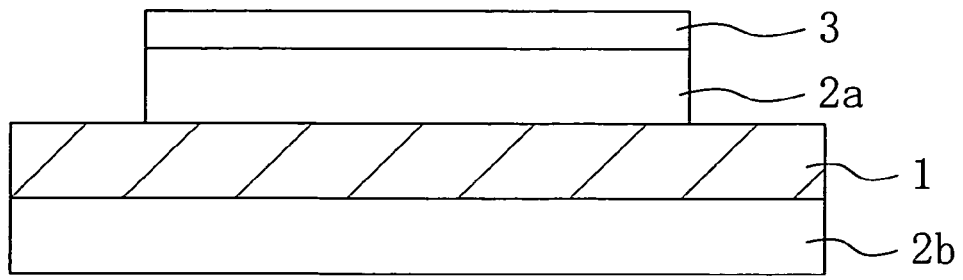
FIG. 5 is a cross-sectional view of a patterned active region formed in an active-region formation step.

Thereafter, as shown in FIG. 5, the oxide film 3 and the first monocrystalline silicon layer 2*a* are removed by etching until the silicon oxide film 1 is exposed. The gate oxide film 3 and the active region 2*a* are thus patterned with an island shape. The etching method used in this step may be either a wet etching method or a dry etching method.

In other words, in the element formation step, the front surface of the silicon oxide film 1 is exposed by removing the first monocrystalline silicon layer 2*a* between adjacent TFTs.

Figure 6:
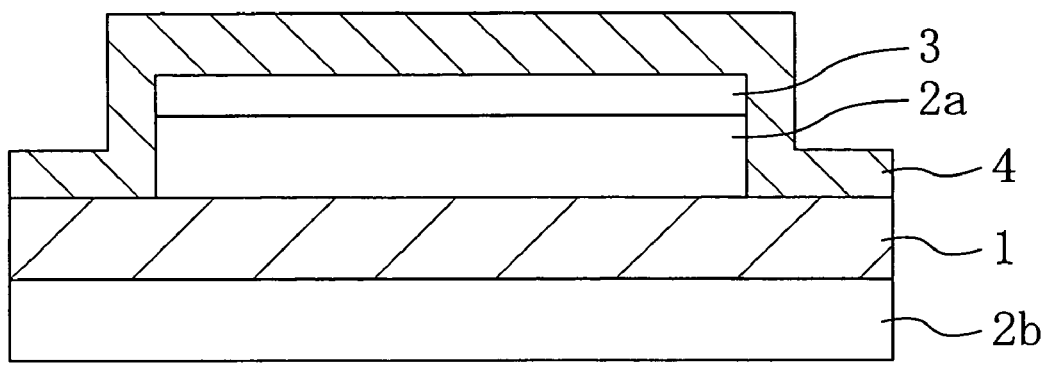
FIG. 6 is a cross-sectional view of a conductive film formed in a gate-electrode formation step.

As shown in FIG. 6, in the gate-electrode formation step, a conductive film 4 that will become a gate electrode 4 is first deposited on the whole surface of the substrate. In order to ensure a desired electric resistance, the conductive film 4 is formed by depositing polysilicon or amorphous silicon by an LP-CVD method or by depositing aluminum or another metal or an alloy by a sputtering method.

Figure 7:
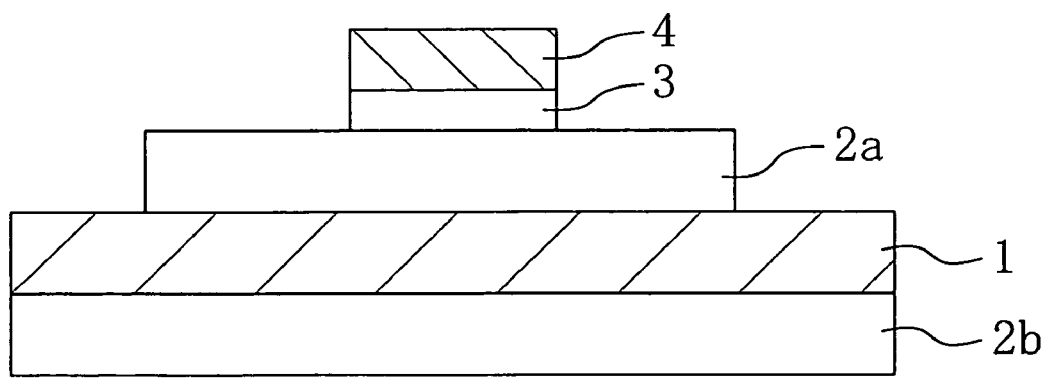
FIG. 7 is a cross-sectional view of a patterned gate electrode formed in a gate-electrode formation step.

As shown in FIG. 7, the gate electrode 4 and the gate oxide film 3 are then patterned by etching. In the present embodiment, an anisotropic dry etching method was used for the patterning. Note that a wet etching method may be used instead of a dry etching method.

In general, transistor elements formed on a silicon wafer are isolated from each other by a LOCOS (LOCal Oxidation of Silicon) oxidation method or an improved LOCOS oxidation method. In this method, a step of oxidizing a silicon wafer to such a thickness that does not allow a silicon surface under an element isolation oxide film to be inverted by an operating voltage or a step of depositing an insulating film on a silicon wafer by an LP-CVD method or a PE-CVD method and removing the insulating film other than the insulating film between transistor elements by a CMP (Chemical Mechanical Polishing) method is conducted before a gate electrode is formed.

On the other hand, the present embodiment relates to a TFT substrate for LCDs which has a transmitting region. The first monocrystalline silicon layer 2*a* between TFTs is completely removed by etching until the silicon oxide film 1 is exposed. A part of the insulating protective film 5 of TFTs is deposited on the exposed surface between TFTs. In the present embodiment, the insulating protective film 5 on the front surface of the silicon oxide film 1 forms an insulating film for element isolation, and therefore, a LOCOS oxide film need not be provided separately. The TFT substrate 21 therefore has a simplified structure.

Figure 8:
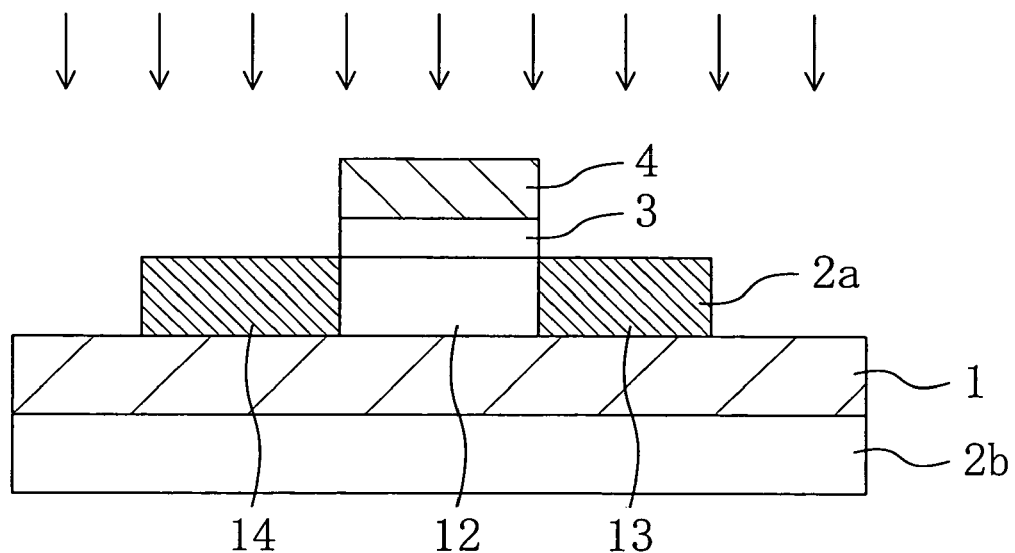
FIG. 8 is a cross-sectional view of an active region formed in an ion implantation step.

As shown in FIG. 8, in the ion implantation step, impurities are implanted into the active region 2*a* by using the gate electrode 4 as a mask in order to form a source region 14 and a drain region 13 having a desired resistance value in the active region 2*a*. As a result, a channel region 12, a region to which impurities are not implanted, is formed on the back side of the gate electrode 4. A drain region 13 is formed on one side of the channel region 12, and a source region 14 is formed on the other side of the channel region 12.

An impurity diffusion method using ion implantation is shown in the present embodiment. However, a solid-phase diffusion method or a vapor-phase diffusion method for applying an impurity diffusion source may be used.

Note that in order to reduce an electric field near the drain region 13, an LDD (Lightly Doped Drain) structure may be formed before impurity diffusion.

Figure 9:
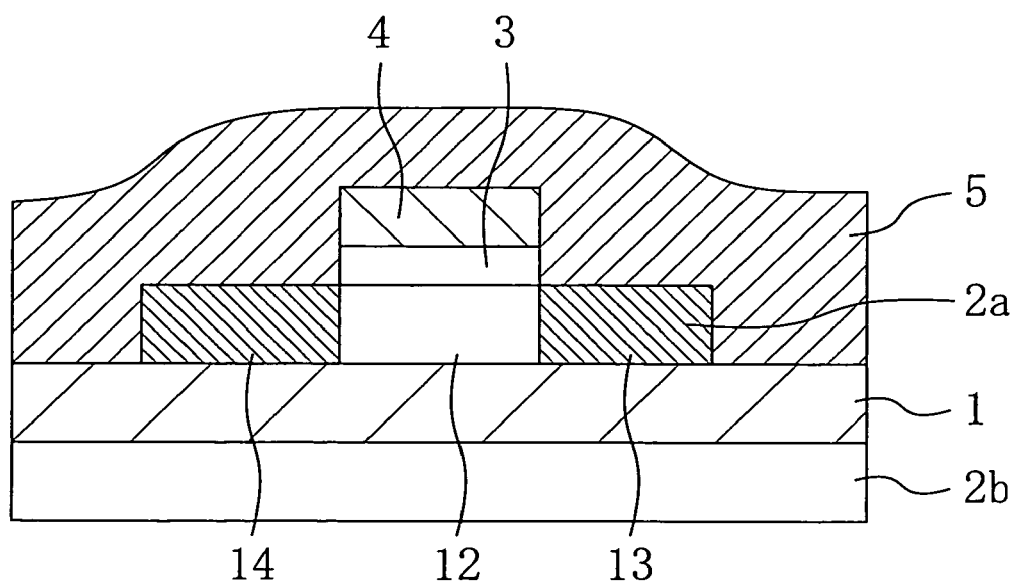
FIG. 9 is a cross-sectional view of an insulating protective film formed in a protective-film formation step.

As shown in FIG. 9, in the protective-film formation step, an insulating protective film 5 is deposited on the front surface of the silicon oxide film 1, the gate electrode 4, the drain region 13, and the source region 14 by an LP-CVD method or a PC-CVD method. The insulating protective film 5 has a thickness of about several microns.

Figure 10:
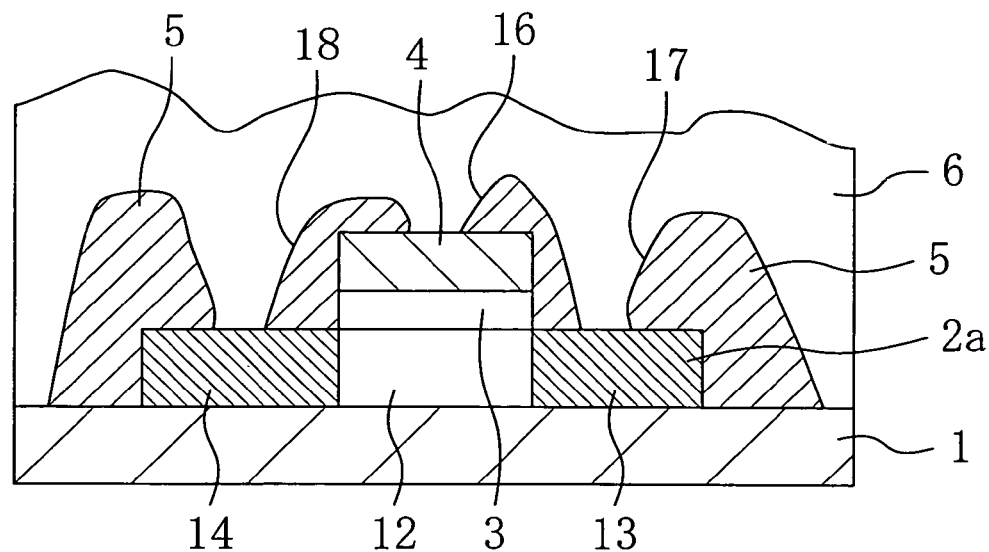
FIG. 10 is a cross-sectional view of a wiring material formed in a wiring formation step.

As shown in FIG. 10, in the wiring formation step, contact holes 16, 17, and 18 are first formed in the insulating protective film 5 in order to form a gate wiring 6*g*, a source wiring 6*s*, and a drain wiring 6*d*. The gate electrode 4 is exposed through the contact hole 16. The drain region 13 and the source region 14 are exposed through the contact holes 17 and 18, respectively.

Thereafter, a wiring material 6 is deposited on the whole surface of the substrate by an LP-CVD method, a PE-CVD method, or a sputtering method so that the contact holes 16, 17, and 18 are filled with the wiring material 6. In order to obtain a prescribed electric resistance, the wiring material 6 is preferably aluminum, copper, an alloy thereof, or the like.

The wiring material 6 is then patterned into a gate wiring 6*g*, a source wiring 6*s*, and a drain wiring 6*d* as shown in FIG. 1 by a wet etching method or a dry etching method. In the present embodiment, the wirings 6*g*, 6*s*, and 6*d* are patterned by a single process. Therefore, the present embodiment requires four masks in total, while a common manufacturing method requires five masks. In other words, the present embodiment can reduce a required number of masks.

Thereafter, a pixel electrode (not shown) that is connected to the drain region 13, an alignment film, and the like are formed. A counter substrate 22 having a color filter, a polarizing plate, and the like is then laminated to the front surface of the TFT substrate 21 with a liquid crystal layer 23 interposed therebetween as described below. A liquid crystal display element 20 can thus be formed. In this state, however, the second monocrystalline silicon layer 2*b* having a thickness of about several tens of nanometers is present on the back surface of the silicon oxide film 1. Therefore, light cannot be transmitted from the back surface of the TFT substrate 21.

In order to enable light to be transmitted from the back surface of the TFT substrate 21 to the liquid crystal layer 23, the removing step, the step of removing the second monocrystalline silicon layer 2*b* on the back surface of the silicon oxide film 1, is conducted as described below.

First, an etching blocking film (such as photoresist) is formed on the back surface of the TFT substrate 21 after TFTs are produced or after the TFT substrate 21 is laminated to the counter substrate 22. The second monocrystalline silicon layer 2*b* on the back surface of the silicon oxide film 1 is then removed by, e.g., a dry etching method. In the present embodiment, the second monocrystalline silicon layer 2*b* is completely removed. As a result, the light transmittance of the TFT substrate 21 is maximized.

FIG. 10 shows the case where the second monocrystalline silicon layer 2*b* is removed before the TFT substrate 21 is laminated to the counter substrate 22.

Note that the counter substrate 22 is provided by forming a transparent electrode (such as ITO (Indium Tin Oxide)) on the surface of, e.g., a commonly used glass substrate and patterning a color filter on the substrate. A space of several microns for the liquid crystal layer 23 is required between the TFT substrate 21 and the counter substrate 22. Therefore, when the TFT substrate 21 and the counter substrate 22 are laminated to each other, a plurality of spacers are inserted between the TFT substrate 21 and the counter substrate 22. A liquid crystal display element 20 is completed by introducing a liquid crystal material into this space under vacuum. Instead of introducing a liquid crystal material into the space under vacuum, the liquid crystal display element 20 may alternatively be completed by dropping a liquid crystal material to a substrate to obtain a uniform thickness and then laminating a substrate having a patterned color filter to the substrate.

A liquid crystal display module is completed by mounting integrated circuitry for driving liquid crystal and a reinforcing outer frame to the liquid crystal display element 20. A transmissive LCD S is completed by mounting the backlight 30 to the liquid crystal display module.

[Effects of the First Embodiment]

According to the first embodiment, a plurality of TFTs having a monocrystalline silicon layer 2a are formed in the silicon oxide film 1 that forms a transmitting region. This enables an LCD to provide transmissive display and enables an operating frequency of the TFTs to be significantly increased as compared to TFTs having polysilicon, amorphous silicon, or the like. As a result, especially moving-image display capability can be significantly improved.

TFTs having an amorphous silicon layer or a polysilicon layer have an electron mobility of about 150 cm$^2$/Vs, whereas TFTs having a monocrystalline silicon layer have an electron mobility of about 1,000 cm$^2$V/s. Therefore, the TFTs of the present embodiment can achieve an operating frequency about seven times as high as that of the TFTs having an amorphous silicon layer or a polysilicon layer.

The insulating substrate 1 of the TFT substrate 21 is formed from a silicon oxide film. Therefore, the insulating substrate 1 has a higher melting point than that (about 600° C.) of a commonly used glass substrate. This allows TFTs having an active region of a monocrystalline silicon layer to be formed on the TFT substrate 21.

Moreover, since the second monocrystalline silicon layer 2b on the back surface of the TFT substrate 21 is completely removed, luminance of transmitted light can be improved.

The TFT substrate 21 is laminated to the counter substrate 22 with the liquid crystal layer 23 interposed therebetween. Therefore, sufficient overall strength can be assured even when the strength of the TFT substrate 21 is relatively small.

In the present embodiment, the TFT substrate 21 includes monocrystalline silicon 2a, and therefore, can resist a processing temperature of, e.g., 1,000° C. Accordingly, integrated circuitry for driving liquid crystal can be simultaneously formed on the same substrate in the TFT manufacturing process. This eliminates the need to provide separate integrated circuitry for driving liquid crystal in the liquid crystal display element 20. As a result, manufacturing of system-on-chips is facilitated, and manufacturing costs can be reduced while enabling manufacturing of a liquid crystal display element 20 having a smaller area.

Second Embodiment

Figure 12:
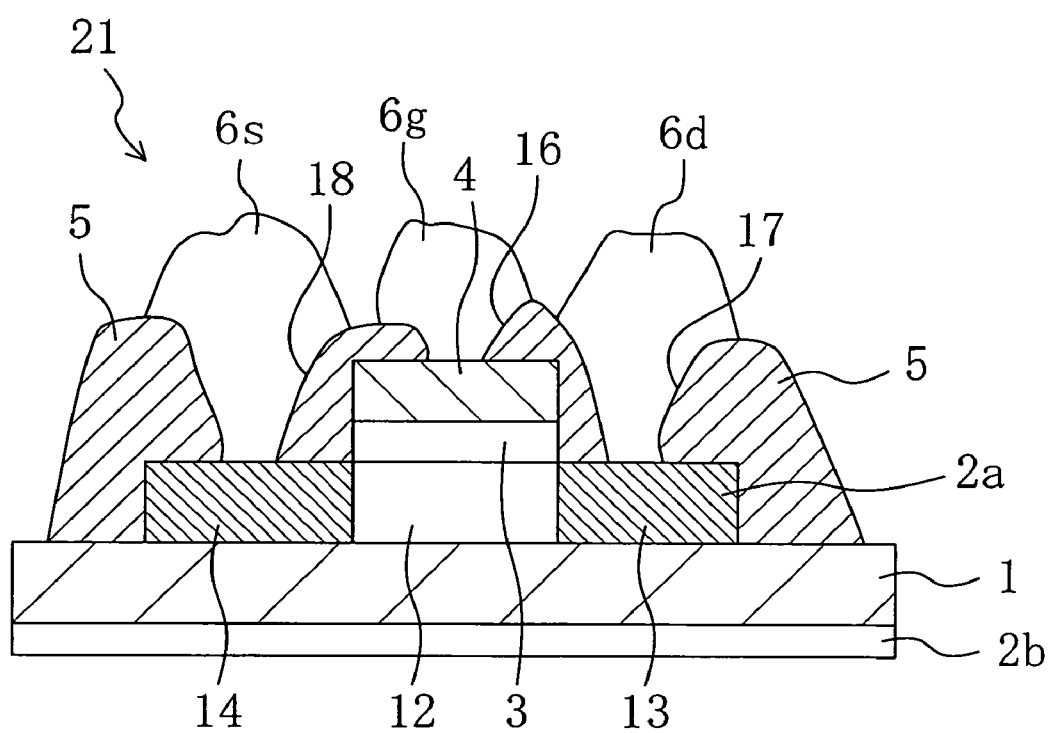
FIG. 12 is an enlarged cross-sectional view of a TFT substrate according to a second embodiment of the present invention.
Figure 13:
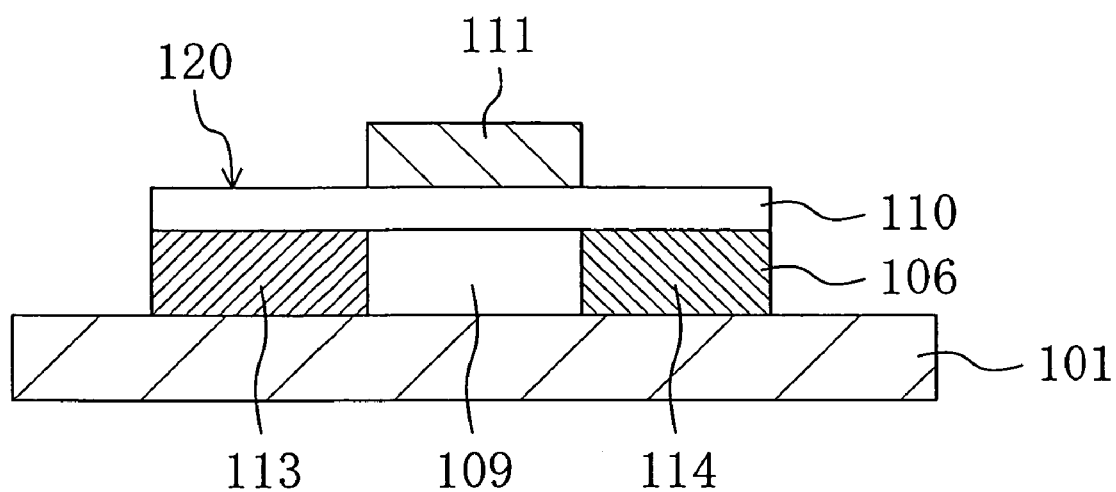
FIG. 13 is an enlarged cross-sectional view of a conventional TFT substrate.
Figure 14:
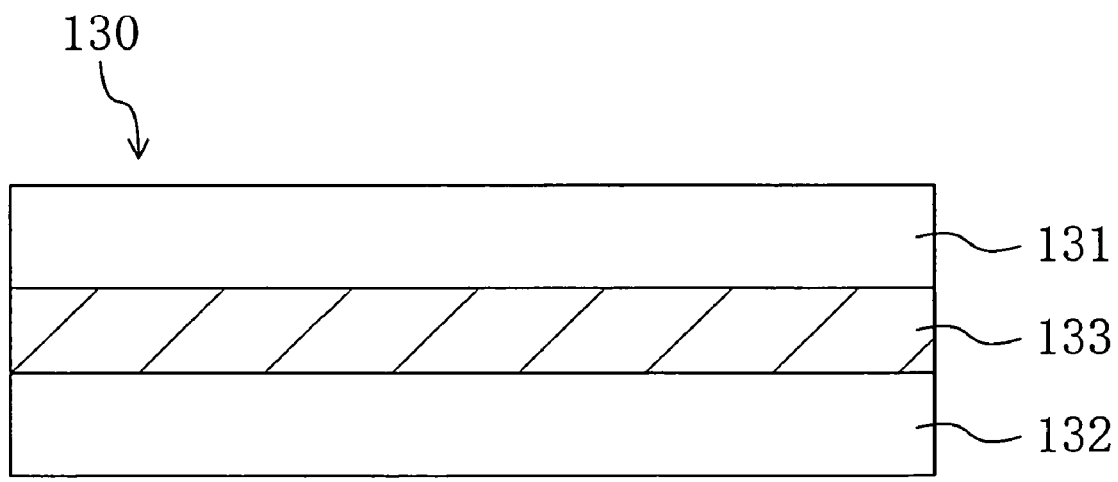
FIG. 14 is a cross-sectional view of a conventional TFT substrate.

FIG. 12 shows a switching element substrate for LCDs, and a manufacturing method of the switching element substrate, and an LCD according to a second embodiment of the present invention. Note that the same parts as those of the first embodiment are denoted with the same reference numerals and characters, and detailed description thereof will be omitted.

In a TFT substrate 21 of the present embodiment, each TFT includes a monocrystalline silicon layer 2a. The TFT substrate 21 has a transmitting region that is provided by forming, on the back surface of a silicon oxide film 1, a second monocrystalline silicon layer 2b having such a thickness that allows light to be transmitted therethrough.

More specifically, in the present embodiment, the second monocrystalline silicon layer 2b having a prescribed thickness is formed on the entire back surface of the silicon oxide film 1 in the removing step. The second monocrystalline silicon layer 2b preferably has a thickness of about several nanometers in order to ensure strength.

A thicker second monocrystalline silicon layer 2b is more preferable in order to ensure the strength. However, a thinner second monocrystalline silicon layer 2b is more preferable in order to improve luminance of transmitted light.

[Effects of the Second Embodiment]

According to the second embodiment, the second monocrystalline silicon layer 2a having such a thickness that allows light to be transmitted therethrough is formed on the back surface of the silicon oxide film 1. Therefore, strength of the TFT substrate 21 can be improved while assuring luminance of transmitted light. As a result, manufacturing of the TFT substrate 21 can be facilitated and reliability can be improved.

Other Embodiments

In the first and second embodiments, the insulating substrate of the TFT substrate 21 is formed from the silicon oxide film 1. However, the present invention is not limited to this. The insulating substrate of the TFT substrate 21 may alternatively be formed from a silicon nitride film, an aluminum oxide film, or the like.

When the insulating substrate 1 is formed from a silicon nitride film, an SOI substrate may be formed by implanting nitrogen ions into a silicon wafer. Alternatively, an SOI substrate may be formed by laminating another silicon wafer to a silicon wafer having a nitride film formed on its surface. On the other hand, when the insulating substrate 1 is formed from an aluminum oxide film, an SOI substrate can be formed by laminating another silicon wafer to a silicon wafer having an aluminum oxide film formed on its surface.

In the first and second embodiments, the second monocrystalline silicon layer 2b is removed by a dry etching method. However, the second monocrystalline silicon layer 2b may alternatively be removed by using a wet etching method, either a mechanical polishing method or a chemical polishing method, or both a mechanical polishing method and a chemical polishing method (i.e., a CMP method).

As has been described above, the present invention is useful for a switching element substrate for LCDs for transmissive display, a manufacturing method of the switching element substrate, and an LCD. The present invention is especially suitable for significantly improving an operating frequency of switching elements in a switching element substrate.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A switching element substrate for a liquid crystal display device for transmissive display, comprising:
    an insulating substrate having a first surface and a second surface, opposed to the first surface;

a plurality of switching elements formed on one of the first and second surfaces of the insulating substrate; and a first monocrystalline silicon layer formed on and in contact with the other one of the first and second surfaces of the insulating substrate, wherein a thickness of the first monocrystalline silicon layer allows light to be transmitted therethrough, each of the switching elements includes a second monocrystalline silicon layer that is on and in contact with said one of the first and second surfaces of the insulating substrate on which the plurality of switching elements are formed, and the second monocrystalline silicon layer comprises a source region, a channel region and a drain region of said each of the switching elements, and the thickness of the first monocrystalline silicon layer is thinner than a thickness of the second monocrystalline silicon layer.

2. The switching element substrate according to claim 1, wherein the insulating substrate is a silicon oxide film.

3. The switching element substrate according to claim 1, wherein the insulating substrate is a silicon nitride film.

4. The switching element substrate according to claim 1, wherein the insulating substrate is an aluminum oxide film.

5. The switching element substrate according to claim 1, wherein said one of the first and second surfaces of the insulating substrate on which the plurality of switching elements is formed is exposed by removing the second monocrystalline silicon layer between adjacent switching elements.

6. The switching element substrate according to claim 1, wherein the switching elements are thin film transistors.

7. A liquid crystal transmissive display device, comprising:

a switching element substrate which includes an insulating substrate and a plurality of switching elements formed on one of first and second opposing surfaces of the insulating substrate;

a first monocrystalline silicon layer formed on and in contact with the other one of the first and second surfaces of the insulating substrate;

a counter substrate which faces the switching element substrate; and a liquid crystal layer which is provided between the counter substrate and the switching element substrate, wherein a thickness of the first monocrystalline silicon layer allows light to be transmitted therethrough, and each of the switching elements includes a second monocrystalline silicon layer that is on and in contact with said one of the first and second surfaces of the insulating substrate on which the plurality of switching elements are formed, and the second monocrystalline silicon layer comprises a source region, a channel region and a drain region of said each of the switching elements, and the thickness of the first monocrystalline silicon layer is thinner than a thickness of the second monocrystalline silicon layer.

* * * * *